United States Patent [19]
Claisse et al.

[11] Patent Number: 6,023,485
[45] Date of Patent: Feb. 8, 2000

[54] VERTICAL CAVITY SURFACE EMITTING LASER ARRAY WITH INTEGRATED PHOTODETECTOR

[75] Inventors: Paul R. Claisse, Gilbert; Wenbin Jiang, Phoenix, both of Ariz.

[73] Assignee: Motorola, Inc., Schaumburg, Ill.

[21] Appl. No.: 09/024,628

[22] Filed: Feb. 17, 1998

[51] Int. Cl.[7] ........................................ H01S 3/19
[52] U.S. Cl. ........................ 372/50; 372/46; 372/96
[58] Field of Search .................... 372/45, 46, 50, 372/96, 97

[56] References Cited

U.S. PATENT DOCUMENTS

| | | | |
|---|---|---|---|
| 5,471,701 | 12/1995 | Hibbs-Brenner | 372/50 |
| 5,574,744 | 11/1996 | Gaw et al. | 372/50 |
| 5,757,837 | 5/1998 | Lim et al. | 372/50 |
| 5,892,786 | 4/1999 | Lott | 372/50 |
| 5,943,357 | 8/1999 | Lebby et al. | 372/50 |

*Primary Examiner*—Hemang Sanghavi
*Attorney, Agent, or Firm*—Eugene A. Parsons

[57] ABSTRACT

A vertical cavity surface emitting laser array with an integrated PIN photodiode. The PIN photodiode includes a first region of a first doped material, a second region of an undoped material and a third region composed of an n-doped stack of distributed Bragg reflectors. The vertical cavity surface emitting laser includes the n-type stack of distributed Bragg reflectors, an active, and a p-type stack of distributed Bragg reflectors so as to define an optical pathway through which light is generated and passes. The integrated device allows for automatic power control of each of the individual devices forming the array by sequentially scanning the individual devices and generating feedback signals.

20 Claims, 1 Drawing Sheet

VERTICAL CAVITY SURFACE EMITTING LASER ARRAY WITH INTEGRATED PHOTODETECTOR

FIELD OF THE INVENTION

This invention relates, in general, to optical devices and, more particularly, to integrated light emitting devices and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently use to adjust the power input to the edge emitting device, thereby adjusting the power output.

However, automatic power control of a vertical cavity surface emitting laser (VCSEL) is a difficult task because the VCSEL generally emits light from only a single surface, thus making measurement of the output and subsequent adjustment thereof a difficult task. Conventionally, in order to accomplish this task, several optical devices, such as photodiodes, mirrors, beam splitters, and the like are positioned in the optical path of the emission from the VCSEL. To maintain a given output power from a VCSEL it has been previously proposed to integrate a photodetector with the device structure and collect a portion of the lasing light that can then be used in a feedback control system to maintain a constant output power. Each individual VCSEL includes its own photodetector and control circuitry.

Many future applications utilizing VCSEL technology, include VCSEL arrays such as those preferred in parallel data storage, printing and data communications applications. In all of these applications it is advantageous if the output power from each individual VCSEL device of the VCSEL array be maintained at a constant value that is independent of such things as the ambient temperature or age of the actual VCSEL device. Effects such as increasing temperature and aging generally reduce the level of output power from a given output power of a VCSEL device and as such this impacts the performance of the laser device in any given system. However, individual APC of each VCSEL device in a VCSEL array has not been addressed.

It can be readily seen that conventional APC technology of VCSEL devices does not easily enable the automatic power control of individual VCSEL devices which compose an array of VCSELs. Therefore, an integrated article and method for making a VCSEL array with integrated photodetectors for automatic power control of each individual VCSEL device of the array would be highly desirable.

It is a purpose of the present invention to provide a new and improved integrated VCSEL array and photodetector for automatic power control of each individual VCSEL in the array.

It is another purpose of the present invention to provide a new and improved integrated VCSEL array and photodetector which is simple and relatively inexpensive to manufacture It is still another purpose of the present invention to provide a new and improved integrated VCSEL array and photodetector which are integrated with a minimum of labor and cost.

It is a further purpose of the present invention to provide a new and improved integrated VCSEL array and photodetector which can be utilized to control the output of each individual VCSEL device which composes the array.

SUMMARY OF THE INVENTION

The above problems and others are at least partially solved and the above purposes and others are realized in a vertical cavity surface emitting laser array with an integrated photodetector. The photodetector is formed as a PIN photodiode and includes a first region of a first doped material coupled to an electrical contact, a second region of an undoped material disposed on the first region and a third region composed of an n-doped stack of distributed Bragg reflectors. The first and second regions include p-type material and intrinsic material, that in conjunction with the n-type stack of distributed Bragg reflectors define a PIN photodiode. The vertical cavity surface emitting laser includes the n-type stack of distributed Bragg reflectors, an active area disposed on the n-type stack of distributed Bragg reflectors, and a p-type stack of distributed Bragg reflectors disposed on the active area so as to define an optical pathway through which light is generated and passes. The vertical cavity surface emitting laser further includes first and second electrical contacts coupled to the p-type and n-type stacks respectively for supplying operating power thereto.

BRIEF DESCRIPTION OF THE DRAWINGS

Referring to the drawings.

DESCRIPTION OF THE PREFERRED EMBODIMENTS

Figure 1:
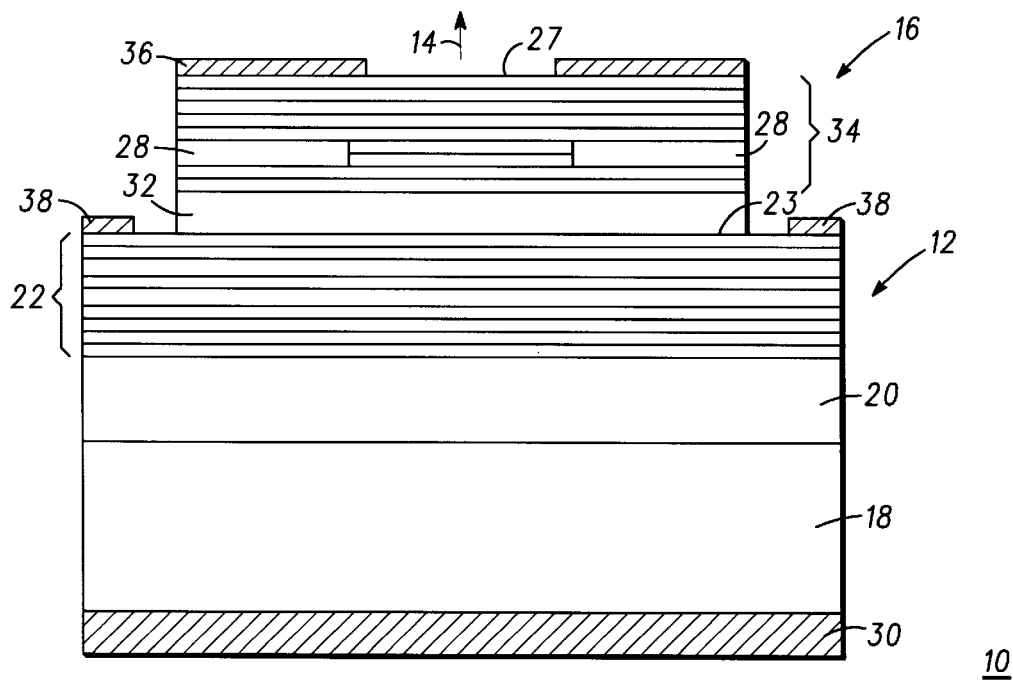
FIG. 1 is a simplified sectional view of a single planar VCSEL with a PIN photodiode.

FIG. 1 illustrates an integrated device 10 that includes a PIN photodiode 12 for measuring light, represented by an arrow 14, from a VCSEL 16. It should be noted that in FIG. 1 VCSEL 16 is represented by a planar VCSEL. An alternative embodiment employing a ridge VCSEL structure is anticipated by this disclosure and typically fabricated in a similar manner. In general, planar VCSEL 16 includes proton implants (discussed presently) included within one of the mirror stacks to define an electrical current pathway for the emission of light from the planar VCSEL. A ridge VCSEL (not shown) generally includes a ridge defined by sidewalls and a surface, utilized to define a light and current path and to contain the current flowing through the ridge VCSEL.

PIN photodiode 12 includes a first region 18, a second region 20, and a third region 22. Third region 22 is composed of a stack of distributed Bragg reflectors (DBRs). As shown in FIG. 1 planar VCSEL 16 includes shared third region 22 of PIN photodiode 12 composed of the stack of distributed Bragg reflectors, an active region 32, and a second stack 34 of distributed Bragg reflectors. As illustrated in FIG. 1, planar VCSEL 16 includes a damaged region 28 utilized to contain the current flowing in VCSEL 16 and, thereby, define a light path.

It should be understood that FIG. 1 is a simplified illustration and that many elements have been purposefully omitted or simplified to more clearly illustrate the present invention. Further, it should be noted that FIG. 1 is a sectional view, thereby illustrating that the integrated device 10 extends into an out of the figure as well as to either side.

It will be understood that integrated device 10 represents a single integrated device.

Generally, device 10 is made by any well-known method or process in the art. However, for the purposes of orienting the reader, a brief description of materials and methods is provided hereinbelow. Device 10 is formed through the deposition of a plurality of epitaxial layers that once complete make up PIN photodiode 12 and VCSEL 16. Regions 18, 20, and 22 typically are made to correspond to a p-doped region, an undoped region or an intrinsic region, and an n-doped region, respectively, thereby forming a PIN photodiode 12. PIN photodiode 12 captures and measures the light emitted backwards through stack 22 of distributed Bragg reflectors toward PIN photodiode 12. This backward emission is proportional to the forward emission power thereby allowing the forward emission output of light 14 to be measured and subsequently adjusted to desired levels.

Regions 18, 20, and 22 are made of any suitable material; however, in a preferred embodiment of the present invention, regions 18 and 20 are made of gallium arsenide (GaAs) or the like, and region 22 is made of aluminum gallium arsenide (AlGaAs) or the like. In a preferred embodiment of the present invention, regions 18, 20, and 22 are formed by depositing a first layer of gallium arsenide (GaAs) which is p-type doped and serves as a substrate layer, depositing a second layer of gallium arsenide (GaAs) on the substrate layer which is undoped, and depositing a third layer composed of a plurality of pairs of distributed Bragg reflectors (discussed presently) composed of aluminum gallium arsenide (AlGaAs) which is n-type doped on the second layer, thereby providing the necessary layers for fabricating PIN photodiode 12. It should be understood that any suitable p-type doping or n-type doping, such as carbon, zinc or silicon, respectively, can be used in doping of the first and third layers. It should also be noted that doping levels for PIN photodiodes are well known and need not be discussed here. Additionally, it should be understood that layer 18 with the p-type dopant and layer 22 having the n-type dopant can be reversed.

Next, to form VCSEL 16, an active area 32, and a second stack 34 of distributed Bragg reflectors are epitaxially deposited on a surface 23 of region 22 by any suitable method, such as molecular beam epitaxy (MBE), metoorganic chemical vapor deposition (MOCVD), or the like. Active area 32 and second stack 34 of distributed Bragg reflectors in conjunction with third region 22 composed of a stack of distributed Bragg reflectors, form VCSEL 16.

Once the epitaxial depositions are complete, an ion implant mask (not shown) is formed on second stack 34 of distributed Bragg reflectors. The ion implant mask is fabricated by any suitable well-known method in the art such as photolithography, deposition, etching, any combination thereof, or the like. The ion implant mask provides openings which expose portions of second stack 34 of distributed Bragg reflectors while covering or protecting other unexposed portions of second stack 34. Typically, the ion implant mask is shaped in a dot pattern, i.e., islands of the ion implant mask are placed on second stack 34. Once the ion implant mask is formed, second stack 34 is ion implanted by any suitable well-known method in the art. Generally, ion implantation injects ions through the exposed surface of second stack 34, while the ion implant mask protects and does not allow the ions to penetrate into the unexposed surface of second stack 34. When the ions pass through the exposed surface of second stack 34 and come to rest in second stack 34, they cause damage in the crystal lattice structure resulting in high resistivity damaged areas 28. Because damaged areas 28 do not conduct current as readily as where there is no damage, current is confined to areas where there is no damage.

Once damaged areas 28 have been formed, a series of depositions and patterning steps are performed to define planar VCSEL 16 and permit the fabrication of conductive regions 36 and 38, more particularly the metal contacts. Generally, the depositions are performed by any suitable well-known method in the art such as chemical vapor deposition (CVD), plasma enhanced chemical vapor deposition (PECVD), sputtering, or the like. In addition, the pattering steps also are performed by any suitable well-known methods or processes in the art, such as photolithography, lift-off, etching, or combination thereof.

To form the metal contacts conductive layer 36 is deposited on a surface 27 of second stack 34 of distributed Bragg reflectors. Conductive layer 36 is made of any suitable electrically conductive material or alloy, such as titanium tungsten, titanium gold, gold, aluminum, silver, or the like. Conductive layer 36 is then subsequently patterned to expose surface 27 of second stack 34 of distributed Bragg reflectors, thus conductive layer 36 provides both a light opening which exposes surface 27, as well as an electrical contact which provides an external electrical contact to the second stack 34. Another electrical contact 38 is provided on an uppermost surface 23, exposed through etching, of region 22 so as to be coupled to region 22 composed of distributed Bragg mirrors. Conductive layer 38 is made of any suitable conductive material or alloys, such as titanium tungsten, titanium gold, gold, aluminum, silver, or the like. Conductive layer 38 provides a shared electrical contact for VCSEL 16 and PIN photodiode 12.

PIN photodiode 12 can be either reverse biased, or without bias, if the speed of PIN photodiode 12 is not a concern. When light 14 is emitted from VCSEL 16, there is a backward emission toward the integrated PIN photodiode 12. The photons absorbed in the undoped gallium arsenide (GaAs) region create electron-hole pairs. Due to either the built-in field or the external field if the PIN photo detector is reverse biased, the electrons will drift toward the n-contact region and the holes will drift toward the p-contact region. If there is a closed electrical loop between the n-contact and the p-contact, current flow can be detected. Depending on the magnitude of the current flow, which is proportional to the incident laser intensity, a feedback loop can be established to control the VCSEL injection current for VCSEL auto power control (APC).

Figure 2:
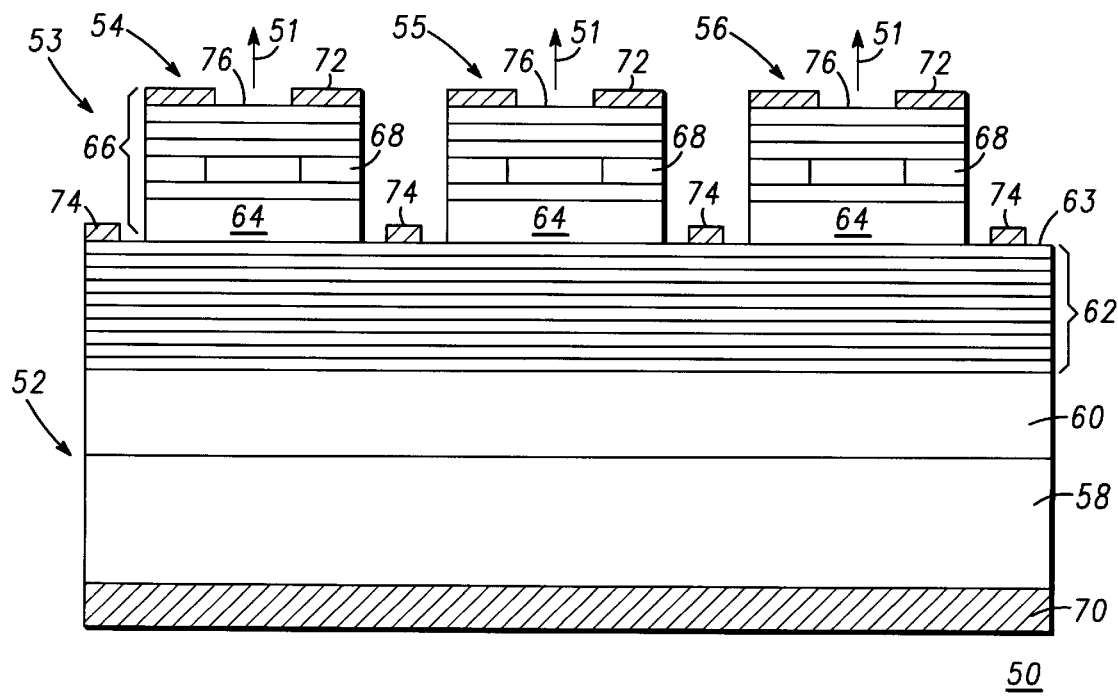
FIG. 2 is a simplified sectional view of a planar VCSEL array with an integrated PIN photodiode in accordance with the present invention.

Referring now to FIG. 2, illustrated in simplified sectional view is an array of VCSELs with an integrated photodetector, generally referenced as 50. Device 50 illustrates an integrated device 50 that includes a single PIN photodiode 52 for measuring light, represented by arrows 51, from an array of VCSELs 53, composed of individual VCSEL devices 54, 55, and 56. It should be noted that in FIG. 2 VCSELs 54, 55, and 56 are represented by planar VCSELs. An alternative embodiment employing an array of VCSELs formed as ridge VCSEL structures is anticipated by this disclosure and typically fabricated in a similar manner.

VCSELs 54, 55 and 56 and PIN photodiode 52 are generally fabricated according to the method discussed with regard to FIG. 1. More particularly, PIN photodiode 52 includes a first region 58, a second region 60, and a third region 62 composed of a stack of distributed Bragg reflectors (DBRs). As shown in FIG. 2 planar VCSELs 54, 55 and 56 share third region 62 of PIN photodiode 52 composed of the stack of distributed Bragg reflectors and additionally include an active region 64, and a second stack 66 of distributed Bragg reflectors. As illustrated in FIG. 2, each planar VCSEL 54, 55 and 56 includes a damaged region 68 utilized to contain the current flowing in VCSELs 54, 55, and 56 and, thereby, define light paths for each VCSEL 54, 55 and 56.

It should be understood that similar to FIG. 1, FIG. 2 is a simplified illustration and that many elements have been purposefully omitted or simplified to more clearly illustrate the present invention. Further, it should be noted that FIG. 2 is a sectional view, thereby illustrating that the integrated device 50 extends into an out of the figure as well as to either side. It will be understood that integrated device 50 represents an array of VCSEL devices, here 54, 55 and 56, and one single photodiode 52 formed as an integrated device, but that any number of VCSEL devices can be included to form the array, the devices composing the array being monitored for automatic power control (APC) by one single photodiode.

Generally, device 50 is made by any well-known method or process in the art. Briefly, as illustrated in FIG. 2, device 50 is formed through the deposition of a plurality of epitaxial layers that once complete, make up PIN photodiode 52 and VCSEL array 53. Regions 58, 60, and 62 typically are made to correspond to a p-doped region, an undoped region or an intrinsic region, and an n-doped region, respectively, thereby forming a PIN photodiode 52. PIN photodiode 52 captures and measures in a scanning or sweeping sequence the backward emission of light 51 from being emitted from each VCSEL 54, 55 and 56, thereby allowing the power output, i.e., light output of each VCSEL 54, 55 and 56, to be measured and subsequently adjusted to a desired level.

Regions 58, 60, and 62 are made of any suitable material; however, in a preferred embodiment of the present invention, regions 58 and 60 are made of gallium arsenide (GaAs) or the like and region 62 is made of aluminum gallium arsenide (AlGaAs) or the like. In a preferred embodiment of the present invention, regions 58, 60, and 62 are formed by depositing a first layer of gallium arsenide (GaAs) which is p-type doped and serves as a substrate layer, a second layer of gallium arsenide (GaAs) which is undoped, and a third layer composed of a plurality of pairs of distributed Bragg reflectors (discussed presently) which is n-type doped, thereby providing the necessary layers for fabricating PIN photodiode 52. It should be understood that any suitable p-type doping or n-type doping, such as carbon, zinc, or silicon, respectively, can be used in doping of the first and third layers. Additionally, it should be understood that layer 58 with the p-type dopant and layer 62 having the n-type dopant can be reversed. A conductive layer 70 provides electrical coupling to region 58 of photodiode 52.

To form array 53 of VCSELS, more particularly VCSELs 54, 55 and 56, an active area 64, and a second stack 66 of distributed Bragg reflectors are epitaxially deposited on a surface 63 of region 62 by any suitable method, such as molecular beam epitaxy (MBE), meto-organic chemical vapor deposition (MOCVD), or the like. Active area 64 and second stack 66 of distributed Bragg reflectors in conjunction with third region 62 composed of a stack of distributed Bragg reflectors, form VCSELs 54, 55 and 56.

Once the epitaxial depositions are complete, an ion implant mask (not shown) is formed on second stack 64 of distributed Bragg reflectors. The ion implant mask is fabricated by any suitable well-known method in the art such as photolithography, deposition, etching, any combination thereof, or the like. The ion implant mask provides openings which expose portions within each VCSEL 54, 55 and 56 of second stack 64 of distributed Bragg reflectors while covering or protecting other unexposed portions of second stack 64. Once the ion implant mask is formed, second stack 64 is ion implanted by any suitable well-known method in the art. Generally, ion implantation injects ions through the exposed surface of second stack 64, while the ion implant mask protects and does not allow the ions to penetrate into the unexposed surface of second stack 64. When the ions pass through the exposed surface of second stack 66 and come to rest in second stack 66, they cause damage in the crystal lattice structure resulting in high resistivity damaged areas 68. Because damaged areas 68 do not conduct current as readily as where there is no damage, current is confined to areas where there is no damage.

A series of depositions and patterning steps are performed to isolate and define each VCSEL 54, 55 and 56 in the array of VCSELs 53 and to allow for the fabrication of conductive regions 72 and 74. Generally, the depositions are performed by any suitable well-known method in the art such as chemical vapor deposition (CVD), plasma enhanced chemical vapor deposition (PECVD), sputtering, or the like. In addition, the pattering steps also are performed by any suitable well-known methods or processes in the art, such as photolithography, lift-off, etching, or combination thereof.

Conductive layer 72 is deposited on a surface 76 of second stack 66 of distributed Bragg reflectors of each VCSEL device 54, 55 and 56. Conductive layer 72 is made of any suitable electrically conductive material or alloy, such as titanium tungsten, titanium gold, gold, aluminum, silver, or the like. Conductive layer 72 is then subsequently patterned to expose surface 76 of second stack 66 of distributed Bragg reflectors of each VCSEL device 54, 55 and 56, thus conductive layer 72 provides both a light opening which exposes surface 76, as well as an electrical contact which provides an external electrical contact to the second stack 66 for each VCSEL device 54, 55 and 56. Additional electrical contacts 74 are provided on uppermost surface 63 of region 62 so as to be coupled to region 62 composed of distributed Bragg mirrors.

Conductive layer 74 is made of any suitable conductive material or alloys, such as titanium tungsten, titanium gold, gold, aluminum, silver, or the like. Conductive layer 72 provides a shared electrical contact for each VCSEL device 54, 55 and 56 and PIN photodiode 52.

PIN photodiode 52 can be either reverse biased, or without bias, if the speed of PIN photodiode 12 is not a concern. When light is emitted from each VCSEL device 54, 55 and 56, the backward emission will be directed toward the integrated PIN photodiode 52. The photons absorbed in the undoped gallium arsenide (GaAs) region create electron-hole pairs. Due to either the built-in field or the external field if the PIN photo detector is reverse biased, the electrons will drift toward the n-contact region and the holes will drift toward the p-contact region. If there is a closed electrical loop between the n-contact and the p-contact, current flow can be detected. Depending on the magnitude of the current flow, which is proportional to the incident laser intensity, a feedback loop can be established to control the VCSEL injection current for VCSEL auto power control (APC).

During operation of the integrated VCSEL array and photodiode 50, each VCSEL device 54, 55 and 56 is individually addressable, thereby capable of being monitored for automatic power control (APC). This APC of each individually addressable VCSEL 54, 55 and 56 is accomplished by a scanning operation of the VCSELs sequentially such that PIN photodiode 52 is only responding to light 51 emitted from one of the VCSEL devices 54, 55 and 56. A feedback control system (not shown) is designed to set the VCSEL drive current corresponding to a predetermined value of current generated in PIN photodiode 52. This scanning operation to set the drive current would be performed periodically during times when VCSEL array 53 is idle, for example in a printing device, when there are no documents in the queue to print. By individually addressing each individual VCSEL device 54, 55 and 56 using a plurality of electrical interconnects, a feedback signal is generated, thus allowing for automatic power control (APC) of each individual VCSEL device 54, 55 and 56. The advantage of this scanning approach is that it reduces the complexity of the processing and interconnects that would be necessary if the individual VCSELs 54, 55 and 56 required their own individual photodiode. An additional benefit of this approach is the uniformity in the output power that would be achieved since it would be a function of the epitaxial uniformity which is excellent over the relatively small dimensions of VCSEL array 53. The limiting factor in this approach that determines the size of array 53 is the relative magnitude of the current produced by each individual VCSEL 54, 55 and 56 under lasing conditions relative to the leakage/dark current of common PIN photodiode 52. It should be understood that while PIN photodiode 52 in anticipated to include a simple PIN photodiode, a resonant cavity PIN photodiode and an avalanche photodiode (APD).

By now it should be appreciated that a novel VCSEL array with integrated PIN photodiode and method for fabrication have been disclosed. The VCSEL array, composed of a plurality of individual VCSEL devices, is integrated with a single PIN photodiode, thereby enabling the light output of each of the VCSEL devices which compose the array to be easily monitored utilizing a scanning or sweeping operation and subsequently adjusted to a desired level. Additionally, since integrated, the VCSEL array and PIN photodiode are fabricated as one device which is highly manufacturable, thus reducing cost and allowing significant improvements in reliability and quality.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser array with an integrated PIN photodiode comprising:
    a PIN photodiode including a first region of a first doped material, a second region of an undoped material disposed on the first region, and a third region of a second doped material disposed on the second region, the third region including a stack of distributed Bragg reflectors;
    an array of vertical cavity surface emitting lasers including the third region of a stack of distributed Bragg reflectors, an active area disposed on the stack of distributed Bragg reflectors, and a second stack of distributed Bragg reflectors disposed on the active area so as to define an optical pathway through which light is generated and passes, the vertical cavity surface emitting laser array further including a plurality of first and second electrical contacts coupled to the stacks of distributed Bragg reflectors for supplying operating power thereto and defining a plurality of individually addressable vertical cavity surface emitting laser devices; and
    a third electrical contact coupled to the first region, second and third regions defining the PIN photodiode and integrated with the vertical cavity surface emitting laser.

2. A vertical cavity surface emitting laser array with integrated PIN photodiode as claimed in claim 1 wherein the first doped material includes gallium arsenide.

3. A vertical cavity surface emitting laser array with integrated PIN photodiode as claimed in claim 2 wherein the first doped material is p-doped.

4. A vertical cavity surface emitting laser array with integrated PIN photodiode as claimed in claim 1 wherein the undoped material is made of gallium arsenide.

5. A vertical cavity surface emitting laser array with integrated PIN photodiode as claimed in claim 1 wherein the second doped material includes aluminum gallium arsenide.

6. A vertical cavity surface emitting laser array with integrated PIN photodiode as claimed in claim 5 wherein the second doped material is n-doped.

7. A vertical cavity surface emitting laser array with integrated PIN photodiode as claimed in claim 5 wherein the first doped material is doped with one of carbon and zinc and wherein the second doped material is doped with silicon.

8. A vertical cavity surface emitting laser array with integrated PIN photodiode comprising:
    a first region of a first doped material disposed on a first conductive layer;
    a second region of an undoped material disposed on the first region;
    a third region of a stack of distributed Bragg reflectors disposed on the second region, the first region, the second region and the third region defining a PIN photodiode;
    an active region disposed on the third region of the stack of distributed Bragg reflectors;
    a second stack of distributed Bragg reflectors disposed on the active region, the third region of the stack of distributed Bragg reflectors, the active region and the second stack of distributed Bragg reflectors defining an array of vertical cavity surface emitting laser devices;
    a first electrical contact electrically coupling the first region, the second region and the third region and for supplying operating power thereto;
    a second electrical contact electrically coupling the second stack of distributed Bragg reflectors and for supplying operating power thereto; and
    a third electrical contact electrically defining a shared electrical contact for the PIN photodiode and each of the VCSEL devices and for supplying operating power thereto.

9. A vertical cavity surface emitting laser array with integrated PIN photodiode as claimed in claim 8 wherein the first doped material includes gallium arsenide.

10. A vertical cavity surface emitting laser array with integrated PIN photodiode as claimed in claim 9 wherein the first doped material is p-doped.

11. A vertical cavity surface emitting laser array with integrated PIN photodiode as claimed in claim 8 wherein the undoped material includes gallium arsenide.

12. A vertical cavity surface emitting laser array with integrated PIN photodiode as claimed in claim 8 wherein the a third region of a stack of distributed Bragg reflectors is aluminum gallium arsenide.

13. A vertical cavity surface emitting laser array with integrated PIN photodiode as claimed in claim 12 wherein the second doped material is n-doped.

14. A vertical cavity surface emitting laser array with integrated PIN photodiode as claimed in claim 8 wherein each of the vertical cavity surface emitting laser array includes a plurality of electrical interconnects for individual addressing of each of the vertical cavity surface emitting laser devices which composed the vertical cavity surface emitting laser array.

15. A vertical cavity surface emitting laser array with integrated PIN photodiode as claimed in claim 14 wherein the vertical cavity surface emitting laser array with integrated PIN photodiode is characterized as accomplishing automatic power control (APC) of each of the individual vertical cavity surface emitting laser devices.

16. A method of fabricating a vertical cavity surface emitting laser array with an integrated PIN photodiode for automatic power control (APC) comprising the steps of:

forming a PIN photodiode having a first region of a first doped material, disposing a second region of an undoped material on the first region and disposing a third region of a second doped material defining a first stack of distributed Bragg reflectors on the second region and electrically coupling a first electrical contact to the first region;

forming an array of vertical cavity surface emitting lasers by disposing an active area on the third region of the PIN photodiode, and disposing a second stack of distributed Bragg reflectors on the active area so as to define an optical pathway through which light is generated and passes, each of the vertical cavity surface emitting laser devices forming the array of vertical cavity surface emitting lasers further including first and second electrical contacts coupled to the shared third region of the PIN photodiode and the second stacks of distributed Bragg reflectors respectively for supplying operating power thereto; and providing interconnects to each of the vertical cavity surface emitting lasers which define the vertical cavity surface emitting laser array, thereby allowing for scanning of the vertical cavity surface emitting laser array and generation of a feedback signal from each of the vertical cavity surface emitting laser devices and automatic power control of each vertical cavity surface emitting laser device.

17. A method of fabricating a vertical cavity surface emitting laser with an integrated PIN photodiode for automatic power control (APC) as claimed in claim 16 where in the step of disposing the active area, the second stack of distributed Bragg reflectors and the first and second electrical contacts further includes, defining the active area, the second stack of distributed Bragg reflectors and the first and second electrical contacts by a photolithography process and etching process.

18. A method of fabricating a vertical cavity surface emitting laser with an integrated PIN photodiode for automatic power control (APC) as claimed in claim 16 where, in the step forming an array of vertical cavity surface emitting lasers, the array of vertical cavity surface emitting lasers are formed as ridge vertical cavity surface emitting laser devices.

19. A method of fabricating a vertical cavity surface emitting laser with an integrated PIN photodiode for automatic power control (APC) as claimed in claim 16 where, in the step forming an array of vertical cavity surface emitting lasers, the array of vertical cavity surface emitting lasers are formed as planar vertical cavity surface emitting laser devices.

20. A method of fabricating a vertical cavity surface emitting laser with an integrated PIN photodiode for automatic power control (APC) as claimed in claim 16 further including the step of monitoring each of the vertical cavity surface emitting lasers which define the vertical cavity surface emitting laser array by sequentially scanning each of the vertical cavity surface emitting lasers and generating feedback signals.

* * * * *